(12) United States Patent
Hong

(10) Patent No.: US 10,056,036 B2
(45) Date of Patent: Aug. 21, 2018

(54) METHOD OF MANUFACTURING CONNECTION STRUCTURE CONNECTING CATHODE ELECTRODE TO AUXILIARY CATHODE ELECTRODE AND ORGANIC LIGHT-EMITTING DIODE DISPLAY DEVICE USING THE SAME

(71) Applicant: LG Display Co., Ltd., Seoul (KR)

(72) Inventor: Sangpyo Hong, Gyeonggi-do (KR)

(73) Assignee: LG Display Co., Ltd., Seoul (KR)

( * ) Notice: Subject to any disclaimer, the term of this patent is extended or adjusted under 35 U.S.C. 154(b) by 24 days.

(21) Appl. No.: 15/226,030

(22) Filed: Aug. 2, 2016

(65) Prior Publication Data
US 2017/0330513 A1 Nov. 16, 2017

(30) Foreign Application Priority Data

May 12, 2016 (KR) .................. 10-2016-0057918

(51) Int. Cl.
*H01L 27/32* (2006.01)
*G09G 3/3258* (2016.01)
(Continued)

(52) U.S. Cl.
CPC .......... *G09G 3/3258* (2013.01); *G09G 3/325* (2013.01); *G09G 3/3266* (2013.01);
(Continued)

(58) Field of Classification Search
CPC ................ H01L 27/32–27/3297; H01L 27/3241–27/3248; H01L 51/50;
(Continued)

(56) References Cited

U.S. PATENT DOCUMENTS 7,619,359 B2 * 11/2009 Kim ............... B82Y 20/00
313/504
8,017,950 B2 * 9/2011 Joo ............... H01L 27/3251
257/40
(Continued)

FOREIGN PATENT DOCUMENTS

KR 10/2004-0051072 A 6/2004
KR 10-2007-0002585 A 1/2007
(Continued)

OTHER PUBLICATIONS

Communication dated Oct. 11, 2017 from the European Patent Office in related European application 16184328.9.

*Primary Examiner* — Maliheh Malek
(74) *Attorney, Agent, or Firm* — Morgan, Lewis & Bockius LLP

(57) ABSTRACT

An organic light-emitting diode display device having an organic light-emitting diode having an anode electrode, an organic emission layer, and a cathode electrode is provided. The organic light-emitting diode display device includes a low potential source line configured to supply a low potential source voltage; and at least one auxiliary cathode electrode configured to connect the low potential source line to the cathode electrode. The at least one auxiliary cathode electrode includes a first electrode layer connected to the low potential source line, and a second electrode layer connected to the first electrode layer at a plurality of first positions and connected to the cathode electrode at a plurality of second positions different from the plurality of first positions.

13 Claims, 10 Drawing Sheets

(51) Int. Cl.
  *H01L 51/56* (2006.01)
  *H01L 51/00* (2006.01)
  *H05B 37/02* (2006.01)
  *H05B 33/08* (2006.01)
  *G09G 3/3266* (2016.01)
  *G09G 3/3291* (2016.01)
  *G09G 3/325* (2016.01)

(52) U.S. Cl.
  CPC ....... *G09G 3/3291* (2013.01); *H01L 27/3258* (2013.01); *H01L 27/3276* (2013.01); *H01L 51/0021* (2013.01); *H01L 51/56* (2013.01); *H05B 33/0896* (2013.01); *H05B 37/0281* (2013.01); *G09G 2300/0809* (2013.01); *G09G 2300/0814* (2013.01); *G09G 2300/0819* (2013.01)

(58) Field of Classification Search
  CPC ............. H01L 2227/32–2227/326; G09G 3/325–3/3291; G09G 2300/0814–2300/0819
  See application file for complete search history.

(56) References Cited

U.S. PATENT DOCUMENTS

| | | | | |
|---|---|---|---|---|
| 8,242,496 B2 * | 8/2012 | Yamazaki | H01L 27/1225 | 257/43 |
| 9,356,078 B2 * | 5/2016 | Han | H01L 27/3246 | |
| 9,741,775 B2 * | 8/2017 | Sakamoto | H01L 27/3246 | |
| 9,786,697 B2 * | 10/2017 | Lee | H01L 27/1255 | |
| 9,910,523 B2 * | 3/2018 | Kim | G06F 3/0412 | |
| 2001/0011868 A1 * | 8/2001 | Fukunaga | H01L 27/1214 | 313/506 |
| 2002/0033664 A1 * | 3/2002 | Kobayashi | H05B 33/14 | 313/504 |
| 2002/0104995 A1 * | 8/2002 | Yamazaki | H01L 27/3246 | 257/72 |
| 2003/0201716 A1 * | 10/2003 | Yamazaki | H01L 27/322 | 313/506 |
| 2005/0001546 A1 * | 1/2005 | Yamaguchi | C23C 14/042 | 313/512 |
| 2005/0040762 A1 * | 2/2005 | Kurihara | H05B 33/04 | 313/512 |
| 2005/0263775 A1 * | 12/2005 | Ikeda | G09G 3/3291 | 257/79 |
| 2005/0269952 A1 * | 12/2005 | Kim | B82Y 20/00 | 313/512 |
| 2006/0145159 A1 * | 7/2006 | Yokoyama | H01L 51/5218 | 257/72 |
| 2007/0001584 A1 | 1/2007 | Lee et al. | | |
| 2007/0176537 A1 * | 8/2007 | Ha | H01L 27/3209 | 313/503 |
| 2007/0194699 A1 * | 8/2007 | Lee | H01L 27/3276 | 313/505 |
| 2009/0302751 A1 | 12/2009 | Hanawa | | |
| 2010/0025664 A1 * | 2/2010 | Park | H01L 27/3248 | 257/40 |
| 2010/0026178 A1 * | 2/2010 | Hwang | H01L 51/5265 | 313/506 |
| 2010/0059754 A1 * | 3/2010 | Lee | H01L 27/322 | 257/59 |
| 2010/0079419 A1 * | 4/2010 | Shibusawa | H01L 27/3272 | 345/204 |
| 2010/0230681 A1 * | 9/2010 | Taneda | H01L 27/3211 | 257/59 |
| 2011/0229994 A1 * | 9/2011 | Jung | H01L 27/3211 | 438/29 |
| 2013/0069085 A1 * | 3/2013 | Kang | H01L 51/5246 | 257/88 |
| 2014/0110680 A1 * | 4/2014 | Choe | H01L 27/3244 | 257/40 |
| 2014/0111116 A1 * | 4/2014 | Shin | H01L 27/3279 | 315/312 |
| 2014/0151652 A1 * | 6/2014 | Im | H01L 51/5228 | 257/40 |
| 2014/0312323 A1 * | 10/2014 | Park | H01L 51/525 | 257/40 |
| 2015/0008400 A1 | 1/2015 | Kim | | |
| 2015/0060809 A1 * | 3/2015 | Kim | H01L 51/5228 | 257/40 |
| 2015/0060810 A1 * | 3/2015 | Han | H01L 27/3246 | 257/40 |
| 2015/0102294 A1 * | 4/2015 | Choi | H01L 51/5203 | 257/40 |
| 2015/0102323 A1 | 4/2015 | Koshihara et al. | | |
| 2015/0144922 A1 | 5/2015 | Moon et al. | | |
| 2015/0179719 A1 * | 6/2015 | Nam | H01L 27/3246 | 257/40 |
| 2015/0185942 A1 * | 7/2015 | Kim | G06F 3/0412 | 345/173 |
| 2016/0035803 A1 * | 2/2016 | Kim | H01L 27/3246 | 257/40 |
| 2016/0079334 A1 * | 3/2016 | Lee | H01L 27/3258 | 257/40 |
| 2016/0095172 A1 * | 3/2016 | Lee | C23C 16/401 | 313/504 |
| 2016/0126304 A1 | 5/2016 | Cho et al. | | |
| 2016/0141545 A1 * | 5/2016 | Kim | G09G 3/3225 | 257/40 |
| 2016/0149155 A1 * | 5/2016 | Kim | H01L 51/5228 | 257/40 |
| 2016/0149156 A1 * | 5/2016 | Kim | H01L 51/5228 | 257/40 |
| 2016/0260922 A1 * | 9/2016 | Choi | H01L 51/0014 | |
| 2016/0351636 A1 * | 12/2016 | Lee | H01L 51/5212 | |
| 2016/0351638 A1 * | 12/2016 | Im | H01L 27/3246 | |
| 2016/0351651 A1 * | 12/2016 | Jang | H01L 27/3276 | |
| 2016/0351846 A1 * | 12/2016 | Kim | H01L 51/5212 | |
| 2016/0351851 A1 * | 12/2016 | Lee | H01L 51/5253 | |
| 2016/0372497 A1 * | 12/2016 | Lee | H01L 27/1255 | |
| 2017/0047386 A1 * | 2/2017 | Lee | H01L 51/5215 | |
| 2017/0062548 A1 * | 3/2017 | Han | H01L 27/3279 | |
| 2017/0062755 A1 * | 3/2017 | Im | H01L 51/56 | |
| 2017/0117350 A1 * | 4/2017 | Jang | H01L 51/0097 | |
| 2017/0125495 A1 * | 5/2017 | Lee | H01L 27/3246 | |
| 2017/0125507 A1 * | 5/2017 | Lee | H01L 27/3276 | |
| 2017/0133449 A1 * | 5/2017 | Kim | H01L 27/3262 | |
| 2017/0133620 A1 * | 5/2017 | Lee | H01L 51/5212 | |
| 2017/0141176 A1 * | 5/2017 | Im | H01L 51/5228 | |
| 2017/0141346 A1 * | 5/2017 | Yao | H01L 51/5228 | |
| 2017/0155078 A1 * | 6/2017 | Lee | H01L 51/5228 | |
| 2017/0162834 A1 * | 6/2017 | Kim | H01L 51/56 | |
| 2017/0170206 A1 * | 6/2017 | Lee | H01L 27/1218 | |
| 2017/0170243 A1 * | 6/2017 | An | G02F 1/163 | |
| 2017/0170246 A1 * | 6/2017 | Im | H01L 27/3246 | |
| 2017/0179208 A1 * | 6/2017 | Jang | H01L 27/3246 | |
| 2017/0185190 A1 * | 6/2017 | Jung | G06F 3/0412 | |
| 2017/0185193 A1 * | 6/2017 | Kim | G06F 3/0412 | |
| 2017/0185194 A1 * | 6/2017 | Kim | G06F 3/0412 | |
| 2017/0185195 A1 * | 6/2017 | Kim | G06F 3/0412 | |
| 2017/0185196 A1 * | 6/2017 | Kim | G06F 3/0412 | |
| 2017/0186831 A1 * | 6/2017 | Nam | H01L 27/3272 | |
| 2017/0192580 A1 * | 7/2017 | Jung | G06F 3/0416 | |
| 2017/0194402 A1 * | 7/2017 | Choi | H01L 27/3211 | |
| 2017/0194415 A1 * | 7/2017 | Choi | H01L 27/0096 | |
| 2017/0207417 A1 * | 7/2017 | Ikeda | H01L 51/5253 | |
| 2017/0250367 A1 * | 8/2017 | Yasukawa | H01L 51/5246 | |
| 2017/0271425 A1 * | 9/2017 | Taneda | H01L 27/3211 | |
| 2018/0012913 A1 * | 1/2018 | Lee | H01L 27/1225 | |

FOREIGN PATENT DOCUMENTS

| KR | 10-2015-0001068 A | 1/2015 |
|---|---|---|
| KR | 10-2015-0061756 A | 6/2015 |

* cited by examiner

METHOD OF MANUFACTURING CONNECTION STRUCTURE CONNECTING CATHODE ELECTRODE TO AUXILIARY CATHODE ELECTRODE AND ORGANIC LIGHT-EMITTING DIODE DISPLAY DEVICE USING THE SAME

CROSS-REFERENCE TO RELATED APPLICATION

This application claims the benefit of priority under 35 U.S.C. § 119(a) to Korean Patent Application 10-2016-0057918 filed on May 12, 2016, which is incorporated by reference herein in its entirety.

BACKGROUND

Field of the Invention

The present disclosure relates to an organic light-emitting display device, and more particularly, to a method of manufacturing a connection structure connecting a cathode electrode to an auxiliary cathode electrode and an organic light-emitting diode display device using the same.

Discussion of the Related Art

Recently, various flat panel display devices capable of reducing weight and the volume, that is, disadvantages of a cathode ray tube (CRT), are being developed. Examples of such a flat panel display device include a liquid crystal display (LCD), a field emission display (FED), a plasma display panel (PDP), and an organic light-emitting diode display (OLED).

The OLED device of the flat panel display devices is a self-emitting display device that emits light by exciting an organic compound, and has advantages of enabling a light weight thin type and simplifying the process because it does not require a backlight used in an LCD. Furthermore, the OLED device is widely used because it can be fabricated at a low temperature and it has a response speed of 1 ms or less, a high-speed response speed, and characteristics, such as low consumption power, a wide viewing angle, and high contrast.

The OLED device includes an organic light-emitting diode for converting electric energy into light energy. The organic light-emitting diode includes an anode electrode, a cathode electrode, and an organic emission layer (EML) disposed between the electrodes. Holes are injected from the anode electrode, and electrons are injected from the cathode electrode. When the holes and the electrons injected through the anode electrode and the cathode electrode are injected into the organic emission layer EML, excitons are formed, and the excitons emit light while emitting energy in a light form.

Such an OLED device includes gate lines, data lines, and a plurality of pixels partitioned by the crossings of common power lines. Each of the pixels includes a switching thin film transistor (hereinafter referred to as "TFT"), a driving TFT, a storage capacitor, and an organic light-emitting diode. When a scan pulse is supplied to a gate line, the switching TFT is turned on and supplies the storage capacitor and the gate electrode of the driving TFT with a data signal supplied to a data line. The driving TFT adjusts the amount of light emitted from the organic light-emitting diode by controlling an electric current supplied from a power line to the organic light-emitting diode in response to the data signal supplied to the gate electrode of the driving TFT. Although the switching TFT is turned off, the storage capacitor charges a data voltage supplied from the data line through the switching TFT so that the driving TFT supplies a constant current until a data signal of a next frame is supplied and thus the emission of the organic light-emitting diode is maintained.

A related art OLED device is described below with reference to FIGS. 1 and 2. FIG. 1 is a cross-sectional view of some region of the related art OLED device, and FIG. 2 is a cross-sectional view of the OLED device taken along line I-I' of FIG. 1.

Referring to FIGS. 1 and 2, the OLED device includes a TFT substrate in which TFTs ST and DT and an organic light-emitting diode OLE connected to the TFTs ST and DT and driven are disposed in each pixel region.

The TFT substrate includes a switching TFT ST, a driving TFT DT connected to the switching TFT ST, and the organic light-emitting diode OLE connected to the driving TFT DT. The switching TFT ST is neighboring to and disposed in the intersection of a gate line GL and a data line DL. The switching TFT ST functions to select a pixel. The switching TFT ST includes a gate electrode SG, a semiconductor layer SA, a source electrode SS, and a drain electrode SD branched from the gate line GL.

The driving TFT DT functions to drive the organic light-emitting diode OLE of a pixel selected by the switching TFT ST. The driving TFT DT includes a gate electrode DG connected to the drain electrode SD of the switching TFT ST, a semiconductor layer DA, a source electrode DS connected to a high potential source line VDL, and a drain electrode DD. The drain electrode DD of the driving TFT DT is connected to the anode electrode ANO of the organic light-emitting diode OLE. A cathode electrode CAT covering most of the substrate is disposed on the anode electrode ANO. An organic emission layer OL is disposed between the anode electrode ANO and the cathode electrode CAT.

A gate pad GP connected to one end of the gate line GL, a data pad DP connected to one end of the data line DL, a high potential source pad VDP formed at one end of the high potential source line VDL, and a low potential source pad VSP formed at one end of the low potential source line VSL are disposed in the outer circumferential portion of a display region in which pixels are disposed.

Referring further to FIG. 2, the semiconductor layers SA and DA of the switching TFT ST and the driving TFT DT are formed on the substrate SUB. The gate electrodes SG and DG are formed on a gate insulating film GI covering the semiconductor layers SA and DA. The gate electrodes SG and DG overlap the central portions of the semiconductor layers SA and DA, respectively. The regions of the semiconductor layers SA and DA overlapping the gate electrodes SG and DG may be defined as channel regions. Furthermore, the gate pad GP may be formed on the gate insulating film GI.

One side portions of the semiconductor layers SA and DA are respectively connected to the source electrodes SS and DS through contract holes formed in the gate insulating film GI, and the other side portions thereof are respectively connected to the drain electrodes SD and DD through contract holes formed in the gate insulating film GI. The source electrodes SS and DS and the drain electrodes SD and DD are formed on an insulating film IN covering the gate electrodes SG and DG. A low potential source line VSL is disposed on the insulating film IN. Furthermore, the data pad DP, the high potential source pad VDP, and the low potential source pad VSP may be disposed on the insulating film IN.

A passivation film PAS is formed on the substrate SUB in which the switching TFT ST and the driving TFT DT have been formed. A planarization film PL is formed on the substrate SUB in which the passivation film PAS has been formed.

The anode electrode ANO that comes in contact with the drain electrode DD of the driving TFT DT through a contract hole is formed on the planarization film PL. Furthermore, a gate pad terminal GPT, a data pad terminal DPT, a high potential source terminal VDPT, and a low potential source terminal VSPT respectively connected to the gate pad GP, the data pad DP, the high potential source pad VDP, and the low potential source pad VSP through contract holes that penetrate the insulating film are formed in an outer circumferential portion in which the planarization film PL has not been formed. A bank pattern BA is formed on the substrate SUB in which the anode electrode ANO has been formed. The bank pattern BA exposes most of the anode electrode ANO. The organic emission layer OL is formed on the exposed anode electrode ANO. The cathode electrode CAT is formed on the substrate in which the organic emission layer OL has been formed. Accordingly, the organic light-emitting diode OLE, including the anode electrode ANO, the organic emission layer OL, and the cathode electrode CAT, is formed.

The cathode electrode CAT to which a low potential source voltage is applied through the low potential source line VSL is formed in most of the entire surface of the substrate SUB. If the cathode electrode CAT is placed in an upper layer as in a top-emission display device, the cathode electrode CAT needs to be formed using a transparent conductive material, such as indium tin oxide (ITO), because transmittance needs to be secured. If the cathode electrode CAT is formed using a transparent conductive material, such as ITO, there is a problem in that picture quality is deteriorated because electric resistance is increased.

If resistance increases as described above, there is a problem in that a low potential source voltage does not have a constant voltage value voltage value in the entire area of the cathode electrode. More specifically, in the case of a large-area display device, there is a phenomenon in which luminance becomes irregular over the entire screen because a voltage deviation depending on the position, for example, a voltage deviation depending on the distance from an incoming portion to which the low potential source voltage is applied may be increased.

SUMMARY

Accordingly, the present invention is directed to a method of manufacturing connection structure connecting cathode electrode to auxiliary cathode electrode and an organic light-emitting diode display device using the same that substantially obviate one or more of the problems due to limitations and disadvantages of the related art.

An object of the present invention is to provide an OLED device capable of minimizing a deviation in the low potential source voltage of a cathode electrode depending on the position.

Another object of the present invention is to provide a method of manufacturing a connection structure capable of efficiently connecting an auxiliary cathode electrode and a cathode electrode for minimizing a deviation in a low potential source voltage supplied to the cathode electrode.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, an OLED device comprises an organic light-emitting diode having an anode electrode, an organic emission layer, and a cathode electrode, the organic light-emitting diode display device comprising: a low potential source line configured to supply a low potential source voltage; and at least one auxiliary cathode electrode configured to connect the low potential source line to the cathode electrode, wherein the at least one auxiliary cathode electrode includes a first electrode layer connected to the low potential source line, and a second electrode layer connected to the first electrode layer at a plurality of first positions and connected to the cathode electrode at a plurality of second positions different from the plurality of first positions.

The organic light-emitting diode display device further comprises a first link pattern configured to connect the low potential source line and the first electrode layer of the auxiliary cathode electrode.

The organic light-emitting diode display device further comprises a second link pattern connected to another end of the at least one auxiliary cathode electrode and disposed in parallel to the first link pattern disposed to intersect the at least one auxiliary cathode electrode.

The organic light-emitting diode display device further comprises at least one third link pattern configured to connect the first link pattern to the second link pattern.

The organic light-emitting diode display device further comprises pixel regions partitioned by gate lines and data lines crossing each other, wherein, in a region in which the cathode electrode and the auxiliary cathode electrode are connected, the first metal layer of the auxiliary cathode electrode is disposed on a gate insulating film covering the gate line, a planarization layer having an opening portion exposing the first metal layer at the plurality of first positions is disposed on the first metal layer, a second metal layer is disposed on the planarization layer and connected to the first metal layer at the plurality of first positions, a residual organic emission layer is disposed at positions of the second metal layer corresponding to the plurality of first positions, and the cathode electrode is disposed on the residual organic emission layer and the second metal layer, and connected to the second metal layer at the plurality of second positions.

The first link pattern is disposed on the same layer as the gate line and made of the same material as the gate line, and the low potential source line is disposed on the gate insulating layer and made of with the same material as the data line.

The low potential source line is connected to the first link pattern exposed through a contract hole penetrating the gate insulating layer in a non-display region.

The cathode electrode is connected to the low potential source line through a contract hole through which the low potential source line is exposed in the non-display region.

The anode electrode and the second metal layer are made of a transparent conductive material, and the first link pattern and the first metal layer are made of a low resistance metal material having a specific resistance lower than the transparent conductive material.

In another aspect, a method of manufacturing a connection structure for connecting a cathode electrode and an auxiliary cathode electrode in an OLED device is disclosed. The OLED device includes an anode electrode, an organic emission layer, and a cathode electrode disposed in pixel regions partitioned by gate lines and data lines crossing each other. The method comprises: forming a first metal layer on a gate insulating film covering the gate line, the first metal layer being in parallel with the data line; forming a planarization film on the first metal layer to expose some region of the first metal layer; depositing a transparent conductive material on the planarization film, and forming the anode electrode and a second metal layer separated from each other by patterning the transparent conductive material; depositing an organic light-emitting material to cover the anode electrode and the second metal layer; jetting a solvent onto a region in which the second metal layer is formed and exposing the second metal layer by drying the solvent; and forming the cathode electrode covering the exposed second metal layer by depositing a transparent conductive material.

The planarization film includes a concavo-convex shape having concave portions and convex portions so that the first metal layer is exposed at a plurality of first positions.

The second metal layer is exposed at a plurality of second positions corresponding to the convex portions of the planarization film.

In accordance with the OLED device of example embodiments of the present invention, there may be an advantage in that a failure attributable to luminance irregularity due to a resistance deviation depending on the position of a display panel can be prevented because a deviation in the low potential source voltage of a cathode electrode depending on a position of the display panel can be minimized.

Furthermore, there may be an advantage in that a contact between an auxiliary cathode electrode and a cathode electrode can be efficiently achieved because a connection obstruction structure for the cathode electrode and auxiliary cathode electrode of the organic light-emitting device is effectively removed.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION

Figure 1:
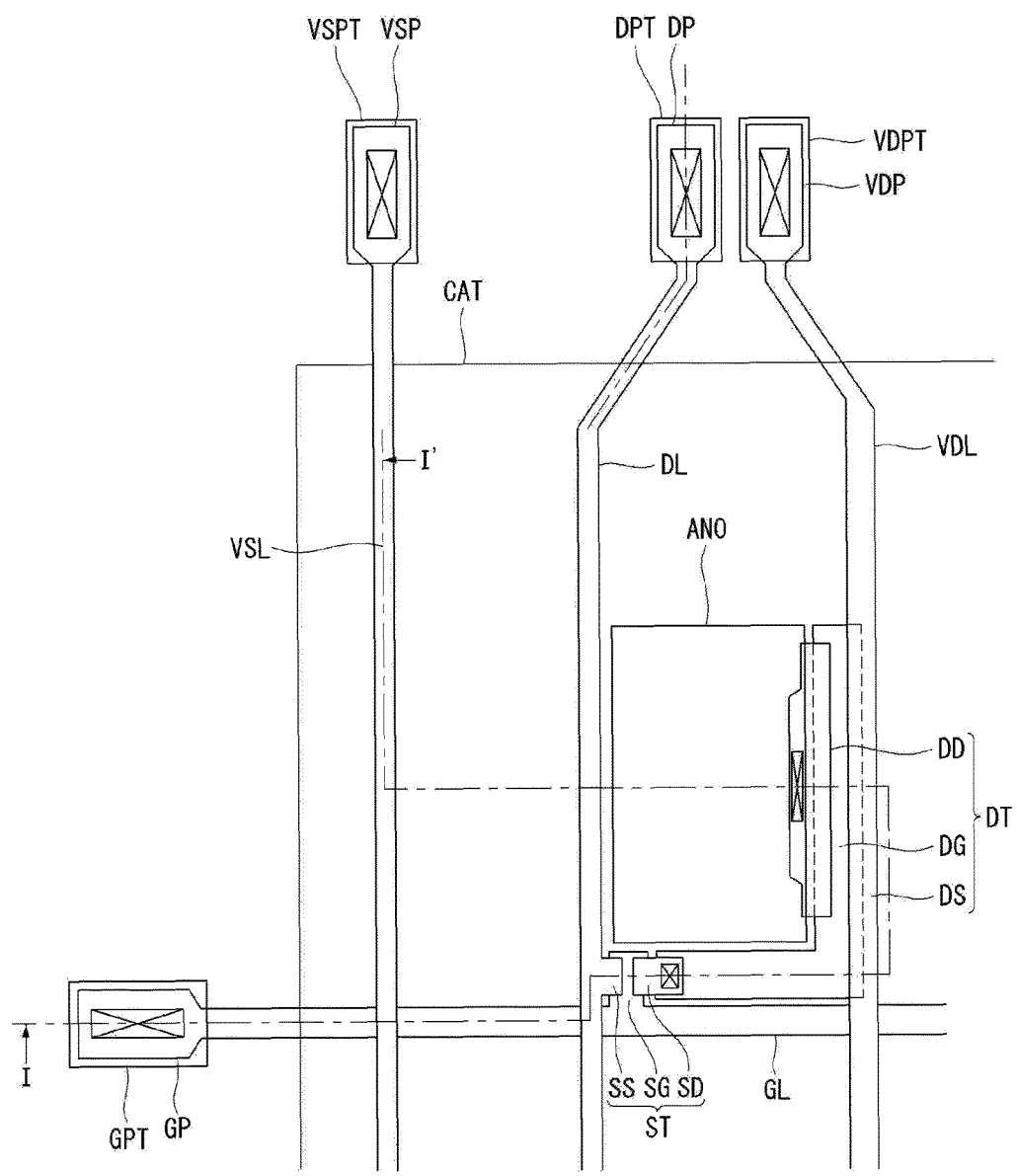
FIG. 1 is a cross-sectional view of some region of a related art OLED device.
Figure 2:
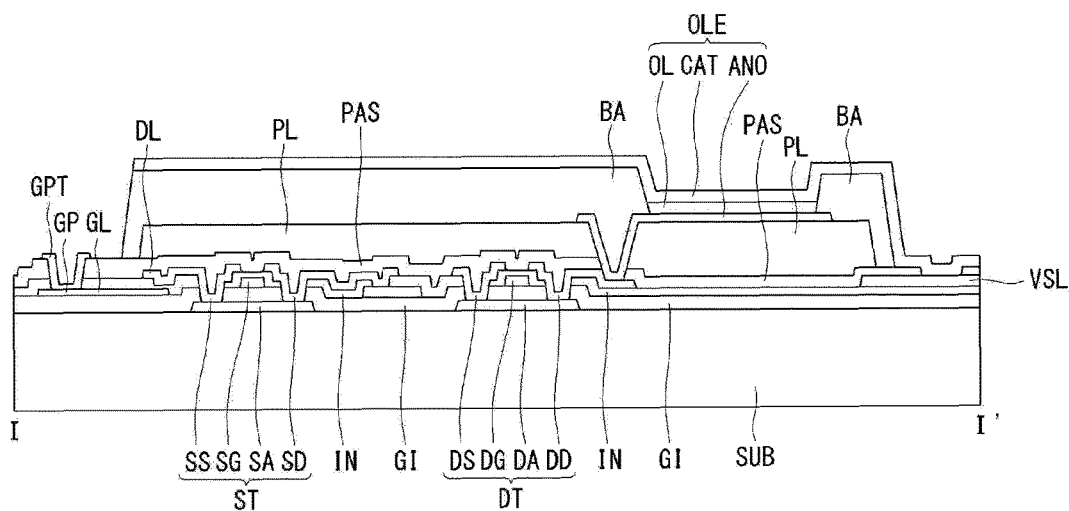
FIG. 2 is a cross-sectional view of the OLED device taken along line I-I' of FIG. 1.

Hereinafter, exemplary embodiments of the present invention are described in detail with reference to the accompanying drawings. The same reference numerals denote substantially the same elements throughout the specification. In the following description, a detailed description of the known functions or elements related to the present invention will be omitted if it is deemed to make the gist of the present invention unnecessarily vague. Furthermore, the names of elements used in the following description have been selected by taking into consideration only the ease of writing this specification, and may be different from the names of actual parts.

Terms including ordinal numbers, such as the first and the second, may be used to describe various elements, but the elements are not limited to meanings unique to the terms. The terms are used to only distinguish one element from the other element.

Figure 3:
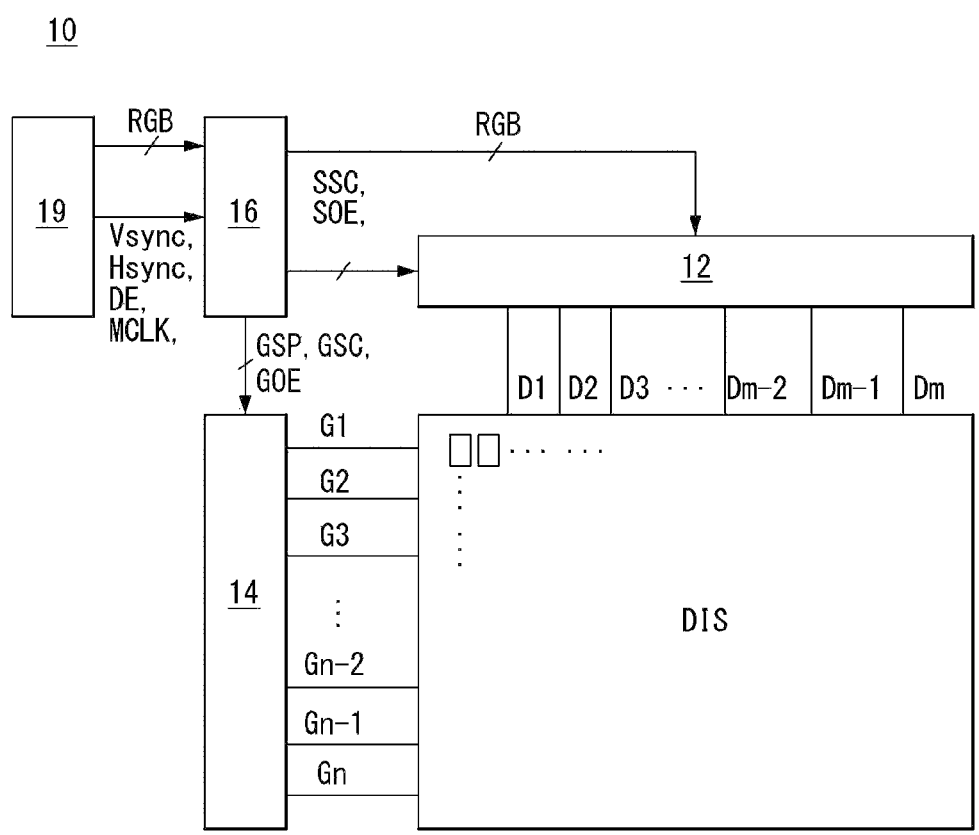
FIG. 3 is a block diagram schematically showing an OLED device according to an embodiment of the present invention.
Figure 4:
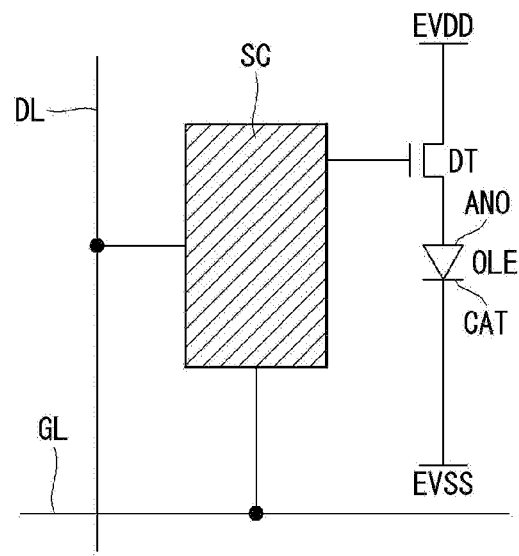
FIG. 4 is an equivalent diagram schematically showing a 1 pixel region of a display panel shown in FIG. 3.

An OLED device according to an embodiment of the present invention is described below with reference to FIGS. 3 and 4. FIG. 3 is a block diagram schematically showing an OLED device according to an embodiment of the present invention, and FIG. 4 is an equivalent diagram schematically showing a 1 pixel region of a display panel shown in FIG. 3.

Referring to FIG. 3, the OLED device 10 according to an embodiment of the present invention includes a display driving circuit 12, 14, and 16 and a display panel DIS.

The display driving circuit includes a data driving circuit 12, a gate driving circuit 14, and a timing controller 16 and writes the video data voltage of an input image in the pixels of the display panel DIS. The data driving circuit 12 generates a data voltage by converting digital video data RGB, received from the timing controller 16, into an analog gamma compensation voltage. The data voltage output by the data driving circuit 12 is supplied to data lines D1~Dm. The gate driving circuit 14 selects pixels of the display panel DIS in which a data voltage is written by sequentially supplying gate lines G1~Gn with a gate pulse synchronized with the data voltage.

The timing controller 16 receives timing signals, such as a vertical sync signal Vsync, a horizontal sync signal Hsync, a data enable signal DE, and a main clock MCLK, from a host system 19 and synchronizes the operating timing of the data driving circuit 12 and the gate driving circuit 14. Data timing control signals for controlling the data driving circuit 12 include a source sampling clock SSC and a source output enable signal SOE. Gate timing control signals for controlling the gate driving circuit 14 include a gate start pulse GSP, a gate shift clock GSC, and a gate output enable signal GOE.

The host system 19 may be implemented using any one of a TV system, a set-top box, a navigation system, a DVD player, a blue-ray player, a personal computer (PC), a home theater system, and a phone system. The host system 19 includes a system on chip (SoC) having a scaler embedded therein and converts the digital video data RGB of an input image into a format suitable for displaying the digital video data on the display panel DIS. The host system 19 transmits the timing signals Vsync, Hsync, DE, and MCLK, together with digital video data, to the timing controller 16.

The pixel array of the display panel DIS includes pixels defined by the data lines D1~Dm (m is a positive integer) and the gate lines G1~Gn (n is a positive integer). Each of the pixels includes an organic light-emitting diode (hereinafter referred to as an "OLED"), that is, a self-emitting device.

Referring to FIG. 4, in the display panel DIS, the plurality of data lines DL and the plurality of gate lines GL are intersected, and pixels are disposed in a matrix form at the intersections of the data lines and the gate lines. Each of the pixels includes an OLED OLE, a driving TFT DT for controlling the amount of current flowing into the OLED OLE, and a programming unit SC for setting the gate-source voltage of the driving TFT DT.

The programming unit SC may include at least one switching TFT and at least one storage capacitor.

The switching TFT is turned on in response to a scan signal from the gate line GL, and applies a data voltage from the data line DL to an electrode on one side of the storage capacitor.

The driving TFT DT adjusts the amount of light emitted by the OLED OLE by controlling the amount of current supplied to the OLED OLE based on the amount of a voltage charged in the storage capacitor. The amount of light emitted by the OLED OLE is proportional to the amount of current supplied by the driving TFT DT.

Each of the pixels is connected to a high potential source voltage source EVDD and a low potential source voltage source EVSS and is supplied with a high potential source voltage and a low potential source voltage from a power generation unit (not shown).

The TFTs forming the pixel may be implemented in a p type or an n type. Furthermore, the semiconductor layer of the TFTs forming the pixel may include amorphous silicon, polysilicon, or oxide. The OLED OLE includes an anode electrode ANO, a cathode electrode CAT, and an organic emission layer interposed between the anode electrode ANO and the cathode electrode CAT. The anode electrode ANO is connected to the driving TFT DT. The organic emission layer includes an emission layer (EML). A hole injection layer (HIL) and a hole transport layer (HTL) and an electron transport layer (ETL) and an electron injection layer (EIL) may be disposed with the emission layer interposed therebetween A configuration for supplying the low potential source voltage to the cathode electrode in the OLED device according to an embodiment of the present invention is described below with reference to FIGS. 5 to 6B.

Figure 5:
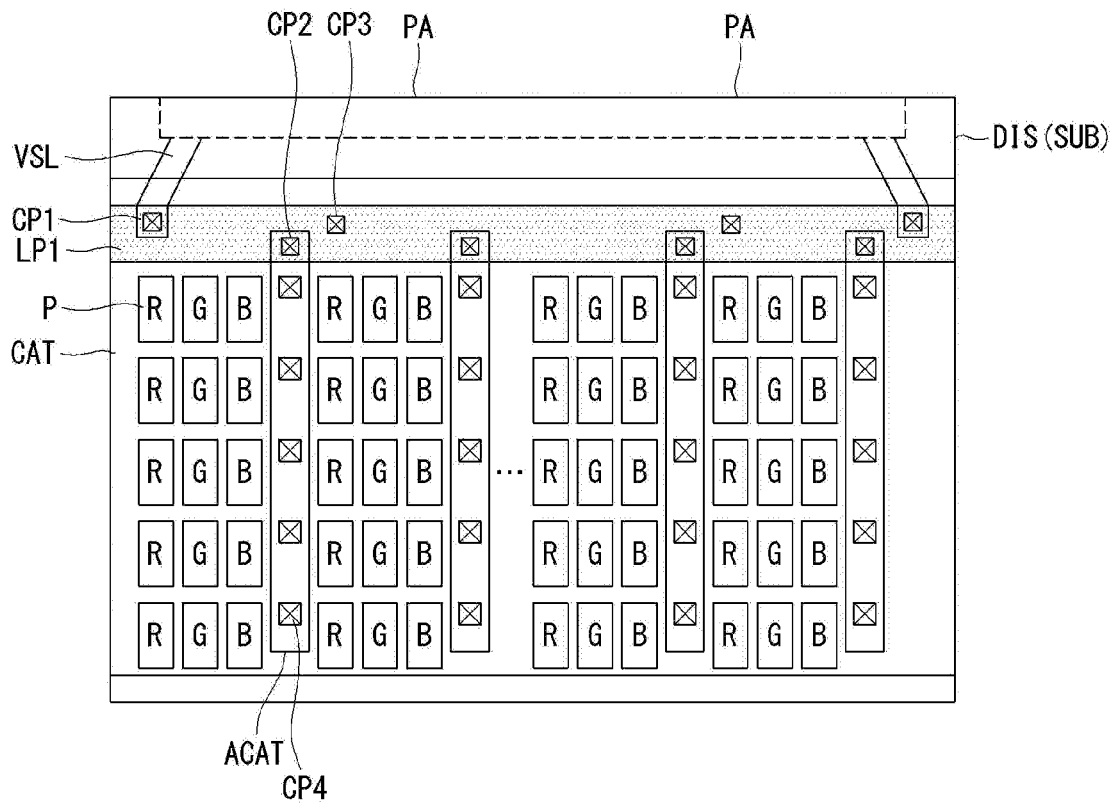
FIG. 5 is a plan view showing a link pattern and auxiliary electrodes for supplying a low potential source voltage to the cathode electrode of the display panel shown in FIG. 3, FIGS. 6A and 6B are plan views schematically showing an example in which the link pattern and the auxiliary electrodes shown in FIG. 5 are disposed.
Figure 6A:
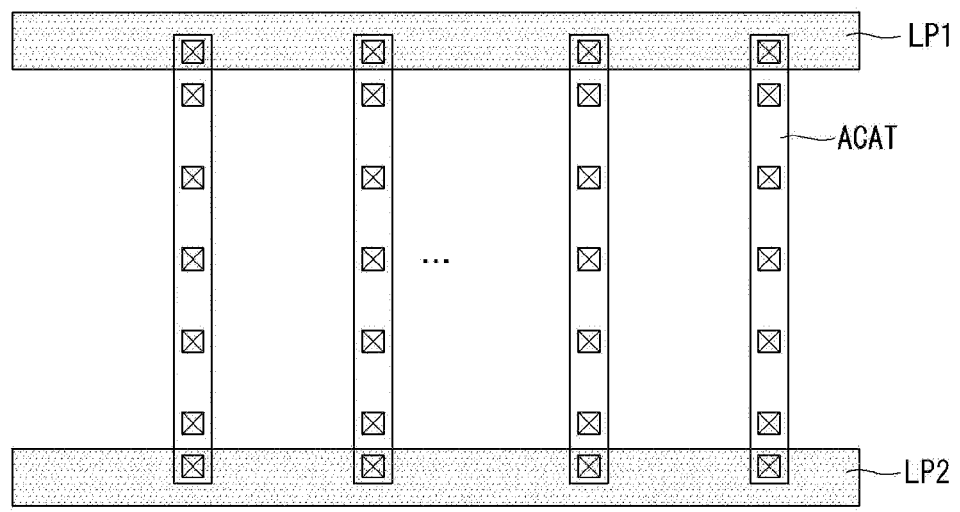
Figure 6B:
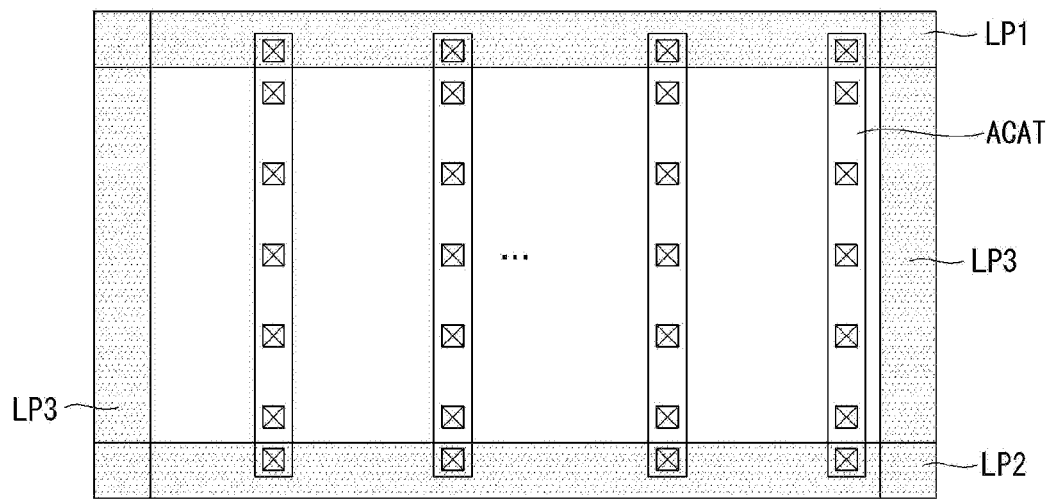

FIG. 5 is a plan view showing a link pattern and auxiliary electrodes for supplying the low potential source voltage to the cathode electrode of the display panel shown in FIG. 3, and FIGS. 6A and 6B are plan views schematically showing an example in which the link pattern and the auxiliary electrodes shown in FIG. 5 are disposed.

Referring to FIG. 5, the OLED device according to an embodiment of the present invention includes the display panel DIS to which driving signals and a power source voltage from the display driving circuit 12, 14, and 16 of FIG. 3 are applied. The display panel DIS includes a low potential source line VSL, the cathode electrode CAT, the auxiliary cathode electrodes ACAT, and a first link pattern LP1.

The low potential source voltage is applied to the low potential source line VSL. For example, the low potential source line VSL may be connected to a pad that belongs to pads included in a pad unit PA and that is supplied with the low potential source voltage. In this case, the pad unit PA may be connected to a flexible film, such as a chip on film (COF). The low potential source voltage output by the power generation unit may be inputted to the low potential source line VSL of the display panel DIS through the flexible film electrically connected to the pad unit PA of the display panel DIS.

The cathode electrode CAT is connected to the low potential source line VSL and supplied with the low potential source voltage. In the case of a top-emission OLED device, the cathode electrode CAT is made of a transparent conductive material, such as indium tin oxide (ITO), indium zinc oxide (IZO), or gallium-doped zinc oxide (GZO), because the cathode electrode CAT placed in an upper layer needs to transmit light. The transparent conductive material has a higher specific resistance value than a metal material. If the cathode electrode CAT including high specific resistance is used as described above, there is a problem in that the low potential source voltage applied to the cathode electrode CAT does not have a constant voltage value in the entire area of the cathode electrode CAT. For example, luminance may not be constant depending on a position because a deviation between a low potential source voltage value in the incoming portion, that is, on the side from which the low potential source voltage is applied, and a low potential source voltage value in a position spaced apart from the incoming portion.

Accordingly, a deviation between low potential source voltage values depending on a position on the display panel needs to be uniform. The OLED device according to an embodiment of the present invention provides a structure capable of uniformly supplying the display panel with the low potential source voltage supplied by the low potential source line.

To this end, the OLED device according to an embodiment of the present invention includes the first link pattern LP1 connected to the low potential source line VSL and a plurality of the auxiliary cathode electrodes ACAT connected to the first link pattern LP1 and configured to supply the low potential source voltage from a plurality of positions to the cathode electrode CAT.

The first link pattern LP1 is connected to the low potential source line VSL at a first contact position CP1, for example and supplied with the low potential source voltage. The first link pattern LP1 is connected to one end of each of the auxiliary cathode electrodes ACAT at a second contact position CP2, thus electrically connecting the auxiliary cathode electrodes ACAT to the low potential source line VSL.

The first link pattern LP1 is made of a material having resistance lower than the cathode electrode CAT, for example, a low resistance metal material. The first link pattern LP1 may have a bar shape extended in the direction that intersects the auxiliary cathode electrodes ACAT.

The first link pattern LP1 may be connected to the cathode electrode CAT at a plurality of positions (e.g., a third contact position CP3) including the incoming portion of the low potential source voltage which is connected to the low potential source line VSL. If the first link pattern LP1 is connected to the cathode electrode CAT at the plurality of positions as described above, there is an advantage in that resistance of the cathode electrode CAT can be further reduced.

The plurality of auxiliary cathode electrodes ACAT is disposed in the direction parallel to the data lines and is connected to the first link pattern LP1 at the second contact position CP2. Furthermore, the plurality of auxiliary cathode electrodes ACAT is connected to the cathode electrode CAT at a plurality of fourth contact positions CP4, as shown in FIG. 5.

The cathode electrode CAT may directly receive the low potential source voltage EVSS, generated by the power generation unit (not shown), through the low potential source line VSL. Furthermore, the cathode electrode CAT may receive the low potential source voltage, generated by the power generation unit, at a plurality of positions through the first link pattern LP1 and the auxiliary cathode electrodes ACAT connected to the low potential source line VSL. Accordingly, the low potential source voltage may be supplied to the cathode electrode CAT along a plurality of low potential source supply paths. Accordingly, there is an advantage in that a voltage deviation for each position, which is generated by the cathode electrode CAT, can be minimized.

Referring to FIGS. 6A and 6B, the OLED device according to an embodiment of the present invention may further include at least one of a second link pattern LP2 and a third link pattern LP3.

Referring to FIG. 6A, the second link pattern LP2 is connected to the other end of each of auxiliary cathode electrodes ACAT. The second link pattern LP2 is made of a low resistance material and may be made of the same material as a first link pattern LP1. The second link pattern LP2 and the other end of the auxiliary cathode electrode ACAT are interconnected at the second contact position CP2.

The second link pattern LP2 may have a bar shape extended in the direction that intersects the auxiliary cathode electrode ACAT.

Referring to FIG. 6B, the third link pattern LP3 is connected to a first link pattern LP1 and a second link pattern LP2, thus electrically connecting the first link pattern LP1 and the second link pattern LP2. The third link pattern LP3 is made of a low resistance material and may be made of the same material as the first link pattern LP1 and/or the second link pattern LP2. The first link pattern LP1, the second link pattern LP2, and the third link pattern LP3 may be formed in the same layer in one body form.

It is advantageous to form an equal potential in the entire surface of the cathode electrode CAT if the second link pattern LP2 and the third link pattern LP3 include a low resistance material. Accordingly, if the second link pattern LP2 and the third link pattern LP3 are additionally included, there is an advantage in that a deviation in the low potential voltage of the cathode electrode CAT depending on the position of a pixel can be minimized.

Figure 7:
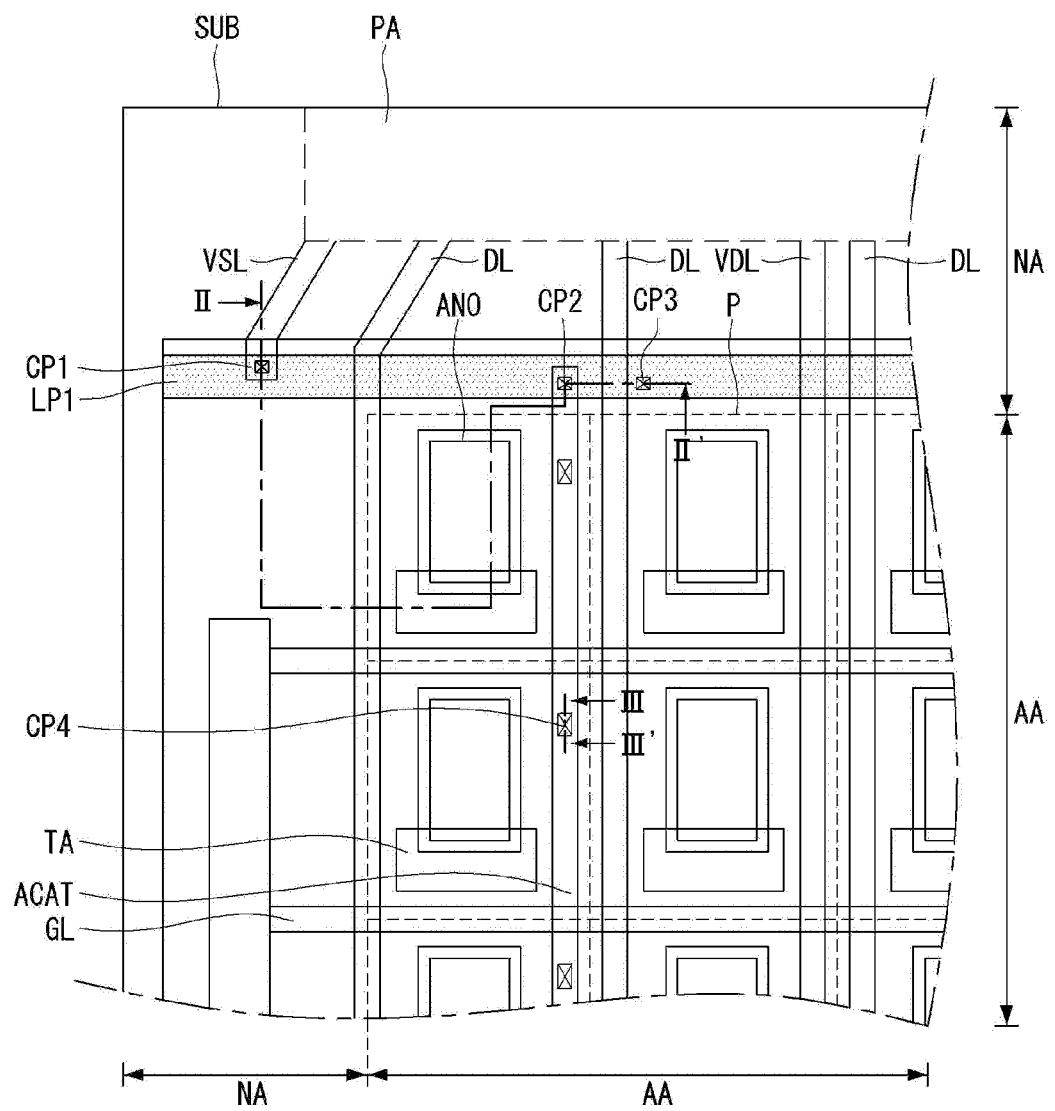
FIG. 7 is a plan view showing some region of the display panel shown in FIG. 3.
Figure 8:
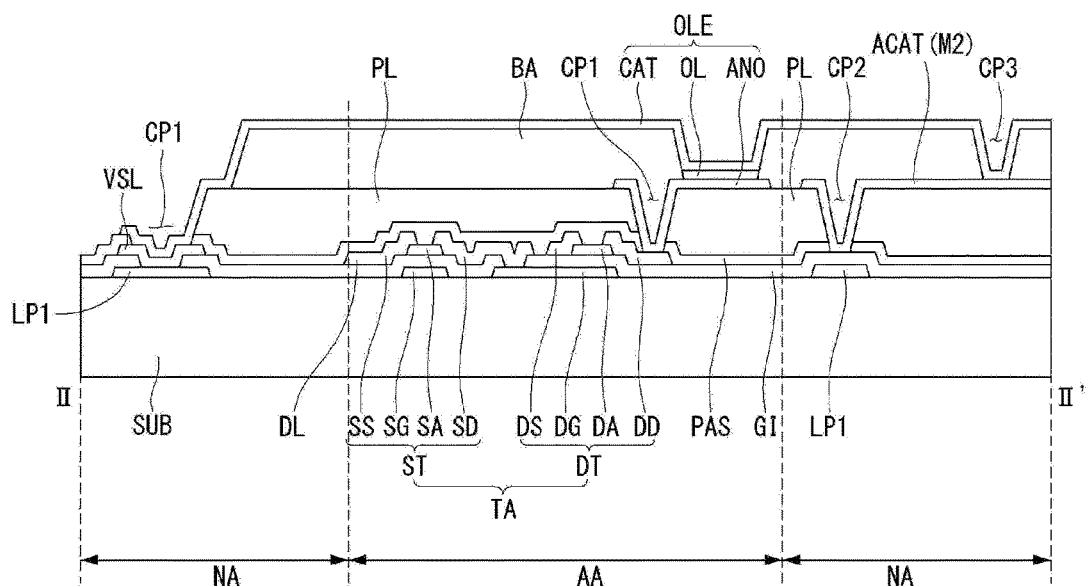
FIG. 8 is a cross-sectional view of the display panel taken along line II-II' of FIG. 7.
Figure 9:
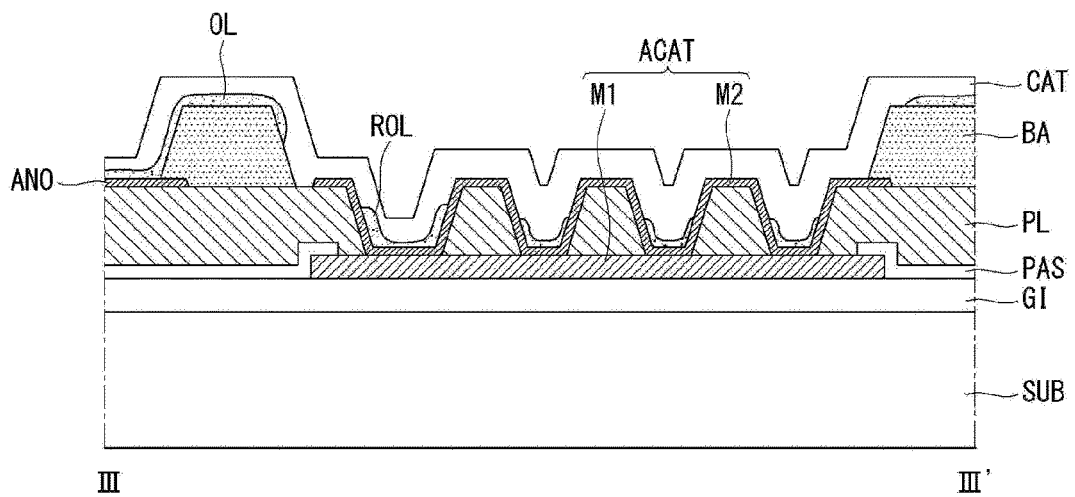
FIG. 9 is a cross-sectional view of the display panel taken along line III-III' of FIG. 7, and FIGS. 10A to 10F are cross-sectional views showing a manufacture process for connecting the cathode electrode and the auxiliary cathode electrode of FIG. 5.

The configuration of the OLED device according to an embodiment of the present invention is described in more detail below with reference to FIGS. 7 to 9. FIG. 7 is a plan view showing some region of the display panel shown in FIG. 3, FIG. 8 is a cross-sectional view of the display panel taken along line II-II' of FIG. 7, and FIG. 9 is a cross-sectional view of the display panel taken along line III-III' of FIG. 7.

Referring to FIG. 7, the OLED device according to an embodiment of the present invention includes a substrate SUB including a display region AA on which image information is displayed and a non-display region NA in which several elements for driving the display region AA are disposed. A plurality of pixels P arranged in a matrix form is disposed in the display region AA.

The plurality of pixels P may be arranged in various forms. For example, the pixels may have the same size or have different sizes. Furthermore, as shown in FIG. 5, the pixels, each having 3 sub-pixels indicative of red (R), green (G), and blue (B) as one unit, may be regularly arranged. The simplest structure of the pixels is described below. The pixels P may be disposed in regions defined by the crossing structures of the gate lines GL proceeding in a first direction and the plurality of data lines DL proceeding in a second direction.

The pad unit PA including a data pad, a high potential source pad, and a low potential source pad is disposed on one side of the non-display region NA. The data line DL is electrically connected to the data pad of the pad unit PA and supplied with a data voltage. A high potential source line VDL is electrically connected to the high potential source pad of the pad unit PA and supplied with a high potential source voltage. The low potential source line VSL is electrically connected to the low potential source pad of the pad unit PA and supplied with a low potential source voltage. The cathode electrode CAT is directly connected to the low potential source line VSL and is supplied with a low potential source voltage. Accordingly, a first supply path along which the low potential source voltage is supplied is formed.

The data line DL is disposed between pixels P neighboring in the first direction. The high potential source line VDL is adjacent to and disposed in the data line DL and disposed between pixels P neighboring in the first direction. In this case, the high potential source line VDL may not be necessarily disposed between pixels P neighboring in the first direction. In this case, any one high potential source line VDL proceeding in the second direction may be electrically connected to at least two pixels P neighboring in the first direction. That is, at least two pixels P neighboring in the first direction may share one high potential source line VDL.

The auxiliary cathode electrode ACAT is disposed between pixels P neighboring in the first direction. The auxiliary cathode electrode ACAT may be disposed in parallel to the data line DL and the high potential source line VDL. The auxiliary cathode electrode ACAT may not be necessarily disposed between pixels P neighboring in the first direction. At least one of the high potential source line VDL and the auxiliary cathode electrode ACAT, together with the data line proceeding in the second direction, may be disposed between the neighboring pixels P. For example, both the high potential source line VDL and the auxiliary cathode electrode ACAT or any one of them may be disposed between the neighboring pixels P. The high potential source line VDL and the auxiliary cathode electrode ACAT may be alternately disposed. For example, one or more high potential source lines VDL may be disposed between adjacent auxiliary cathode electrodes ACAT. Furthermore, one or more auxiliary cathode electrodes ACAT may be disposed between adjacent high potential source lines VDL.

TFTs for driving an OLED are disposed in each of the pixels P. The TFTs may be formed in a TFT region TA defined on one side of the pixel P. The OLED includes an anode electrode ANO, a cathode electrode CAT, and an organic emission layer interposed between the two electrodes ANO and CAT. A region that actually emits light may be determined by the area of the organic emission layer overlapping the anode electrode ANO.

The anode electrode ANO is formed to occupy some region of the pixel P and electrically connected to a TFT formed in the TFT region TA. The anode electrode ANO is formed in each pixel P. The anode electrode ANO is spaced apart from the anode electrode ANO of a neighboring pixel P at a specific interval so that the anode electrode ANO does not come in contact with the anode electrode ANO of a neighboring pixel P. The organic emission layer is formed on the anode electrode ANO. The cathode electrode CAT is widely formed on the organic emission layer to fully cover the area of the display region AA in which at least the pixels P are disposed. The cathode electrode CAT is electrically connected to the auxiliary cathode electrode ACAT at the first contact position CP1.

The first link pattern LP1 is connected to one end of each of the auxiliary cathode electrodes ACAT. The first link pattern LP1 is electrically connected to the auxiliary cathode electrode ACAT at the second contact position CP2. The first link pattern LP1 may be electrically connected to the cathode electrode CAT at the third contact position CP3, if necessary. The first link pattern LP1 is connected to the low potential source line VSL, and supplies the auxiliary cathode electrodes ACAT with a low potential source voltage supplied by the low potential source line VSL. Accordingly, a second supply path along which the low potential source voltage is supplied is formed.

The first link pattern LP1 may be disposed in parallel to the gate lines GL in the non-display region NA. The first link pattern LP1 intersects the data lines DL and the high potential source line VDL. The first link pattern LP1, and the data lines DL and the high potential source line VDL are disposed in different layers with one or more insulating films interposed therebetween so that the first link pattern LP1, and the data lines DL and the high potential source line VDL are short-circuited.

The cross structure of the OLED device according to an embodiment of the present invention is described in more detail below with reference to FIGS. 7 to 9. The substrate SUB of the display panel DIS includes the non-display region NA and the display region AA. The low potential source line VSL and the first link pattern LP1 are disposed in the non-display region NA. A switching TFT ST, a driving TFT DT, and an OLED OLE are disposed in the display region AA.

The gate lines GL, the gate electrode SG of the switching TFT ST, and the gate electrode DG of the driving TFT DT are disposed in the display region AA of the substrate SUB. The first link pattern LP1 is disposed in the non-display region NA of the substrate SUB.

A gate insulating film GI covering the gate lines GL, the gate electrodes SG and DG, and the first link pattern LP1 are disposed on the substrate SUB in which the gate lines GL, the gate electrodes SG and DG, and the first link pattern LP1 have been disposed.

Semiconductor channel layers SA and DA are disposed in the display region AA of the gate insulating film GI so that they overlap the gate electrodes SG and DG, respectively. The data line DL, the first metal layer M1 of the auxiliary cathode electrode ACAT arranged in parallel to the data line DL, source electrodes SS and DS extended from the data line DL and disposed on one side of the semiconductor channel layers SA and DA, and drain electrodes SD and DD spaced apart from the source electrodes SS and DS at a specific interval and disposed on the other side of the semiconductor channel layers SA and DA are disposed in the display region AA of the gate insulating film GI.

In the above structure, the switching TFT ST includes the gate electrode SG, the gate insulating film GI, the channel layer SA, the source electrode SS, and the drain electrode SD. Furthermore, the driving TFT DT includes the gate electrode DG connected to the drain electrode SD of the switching TFT ST, the gate insulating film GI, the channel layer DA, the source electrode DS, and the drain electrode DD.

However, the structure of the TFTs ST and DT according to an embodiment of the present invention is not limited to the above structure. The structure of the TFTs ST and DT may include all of structures, such as a top gate structure and a double gate structure, if they can drive an OLED device in addition to the aforementioned bottom gate structure.

The low potential source line VSL is disposed in the non-display region NA of the gate insulating film GI. The low potential source line VSL is connected to the first link pattern LP1 exposed through a contract hole that penetrates the gate insulating film GI.

A passivation film PAS and a planarization film PL are sequentially disposed on the gate insulating film GI in which the data line DL, the first metal layer M1 of the auxiliary cathode electrode ACAT, the source electrodes SS and DS and drain electrodes SD and DD of the TFTs ST and DT, and the low potential source line VSL have been disposed so that they cover the data line DL, the first metal layer M1 of the auxiliary cathode electrode ACAT, the source electrodes SS and DS and drain electrodes SD and DD of the TFTs ST and DT, and the low potential source line VSL.

The planarization film PL has an island shape so that it has a plurality of opening portions through which the first metal layer M1 is exposed at a plurality of positions in the region in which the first metal layer M1 of the auxiliary cathode electrode ACAT has been formed.

The anode electrode ANO is disposed in the display region AA of the planarization film PL. The anode electrode ANO is connected to the driving drain electrode DD of the driving TFT DT through a contract hole that penetrates the passivation film PAS and the planarization film PL. The second metal layer M2 of the auxiliary cathode electrode ACAT including the same material as the anode electrode ANO is disposed on the planarization film PL. The second metal layer M2 is disposed to be extended from the display region AA to the non-display region NA. The anode electrode ANO and the second metal layer M2 are separated from each other on the planarization film PL. The second metal layer M2 is disposed on the planarization film PL of an island shape and the first metal layer M1 exposed through the opening portions of the planarization film PL of an island shape, and comes in contact with the first metal layer M1 at a plurality of positions.

A bank pattern BA is formed on the planarization film PL in which the anode electrode ANO and the second metal layer M2 of the auxiliary cathode electrode ACAT have been disposed. The bank pattern BA is formed to expose the anode electrode ANO and the auxiliary cathode electrode ACAT. An organic emission layer OL is disposed on the anode electrode ANO exposed through the opening portion of the bank pattern BA. A residual organic emission layer ROL is disposed on the second metal layer M2 of the auxiliary cathode electrode ACAT. The residual organic emission layer ROL may not be present if it is perfectly removed in a process of removing the second metal layer M2.

The cathode electrode CAT made of a transparent conductive material is disposed on the bank pattern BA, the organic emission layer OL, the residual organic emission layer ROL, and the second metal layer M2 of the auxiliary cathode electrode ACAT. Accordingly, the OLED OLE including the anode electrode ANO, the organic emission layer OL, and the cathode electrode CAT is formed. A connection structure in which the cathode electrode CAT is connected to the auxiliary cathode electrode ACAT including the first metal layer M1 and the second metal layer M2 is formed.

The low potential source line VSL may be connected to the cathode electrode CAT in an incoming portion, and may supply a low potential source voltage to the cathode electrode CAT at a plurality of positions through the first link pattern LP1 and the plurality of auxiliary cathode electrodes ACAT.

The first link pattern LP1 is made of a low resistance material. For example, the first link pattern LP1 may be formed of a single layer including Mo, Cu, Ag, Cr, Al, or MoTi or a multiple layer including a stack of Mo, Cu, Ag, Cr, Al, or MoTi. The low potential source line VSL and the first metal layer M1 of the auxiliary cathode electrode ACAT may be made of the same low resistance material as the first link pattern LP1. The second metal layer M2 of the auxiliary cathode electrode ACAT may be made of the same transparent conductive material as the anode electrode ANO.

The connection structure of the cathode electrode CAT and the auxiliary cathode electrode ACAT is described in more detail below with reference to FIG. 9.

The auxiliary cathode electrode ACAT includes the first metal layer M1 disposed on the gate insulating film GI of the display region AA and the second metal layer M2 connected to the first metal layer M1, as shown in FIG. 9. The first metal layer M1 is disposed on the gate insulating film GI in the opening portion region of the bank pattern BA, and is made of the same material as the low potential source line VSL and the data line DL in the same layer as the low potential source line VSL and the data line DL.

The passivation PAS and the planarization layer PL are stacked on the first metal layer M1 to expose the first metal layer M1. The planarization layer PL is formed to have an island shape in the opening portion region of the bank pattern BA, and exposes the first metal layer M1 at the plurality of positions.

The second metal layer M2 is disposed in accordance with the opening portion region of the bank pattern BA on the planarization film PL and the first metal layer M1 exposed through the planarization film PL. The second metal layer M2 is connected to the first metal layer M1, exposed through the planarization layer PL having an island shape, at the plurality of positions. The second metal layer M2 is disposed in the same layer as the anode electrode ANO and made of the same material as the anode electrode ANO.

The second metal layer M2 has a concave portion at each of a plurality of positions where the first metal layer M1 and the second metal layer M2 come in contact with each other and has a convex portion at the top position of the planarization layer P1 by the planarization layer PL having an island shape.

The concave portion of the second metal layer M2 is connected to the first metal layer M1. The residual organic emission layer ROL is formed on the concave portion of the second metal layer M2. The residual organic emission layer ROL is the residue of an organic light-emitting material that remains after the organic light-emitting material on the second metal layer M2 is melted by a solvent and dried. The residual organic emission layer ROL may not be present if the organic light-emitting material is removed by a long-term process.

The cathode electrode CAT is disposed to cover the bank pattern BA, the second metal layer M2, and the residual organic emission layer ROL. Accordingly, the cathode electrode CAT is connected to the first metal layer M1 of the auxiliary cathode electrode ACAT through the second metal layer M2 of the auxiliary cathode electrode ACAT.

Accordingly, the cathode electrode CAT is supplied with the low potential source voltage through the low potential source line VSL and the first link pattern LP1 as shown in FIG. 5, and is also supplied with the low potential source voltage through the low potential source line VSL, the first link pattern LP1, and the auxiliary cathode electrode ACAT at the plurality of positions of the pixel region.

A method of manufacturing the connection structure of the cathode electrode CAT and the auxiliary cathode electrode ACAT is described in more detail below with reference to FIGS. 10A to 10F. The connection structure of the cathode electrode CAT and the auxiliary cathode electrode ACAT is formed in accordance with the opening portion of the bank pattern BA.

Figure 10A:
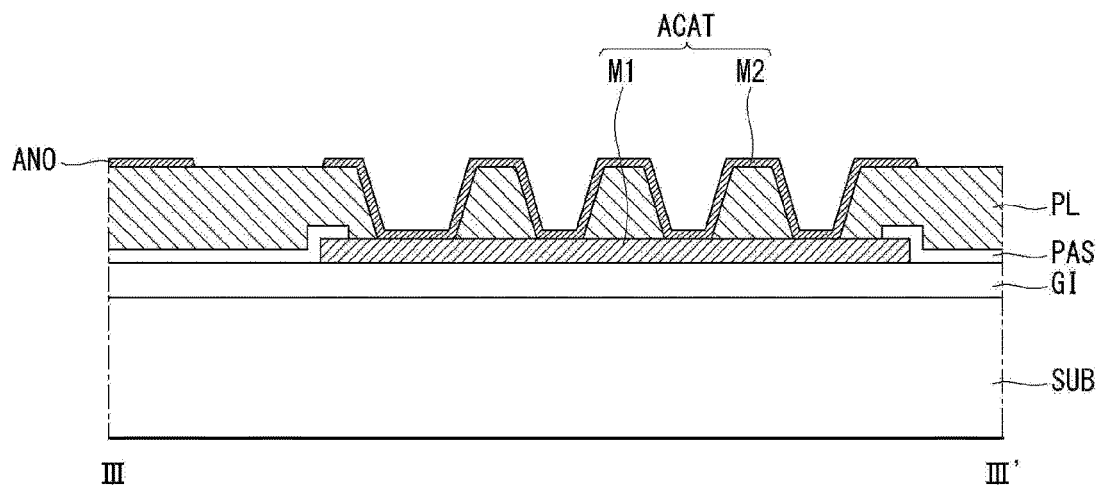

Referring to FIG. 10A, a transparent conductive metal material is disposed on the first metal layer M1 of the auxiliary cathode electrode ACAT, formed on the gate insulating film GI exposed through the opening portion of the bank pattern BA, and the planarization film PL of a concavo-convex structure having an island shape by sputtering. The second metal layer M2 is formed by patterning the transparent conductive metal material. The planarization film PL in which the second metal layer M2 is formed has a concavo-convex structure of an island shape, which has a plurality of opening portions so that the first metal layer M1 is exposed at a plurality of first positions. When the second metal layer M2 is formed, the anode electrode ANO is also formed on the planarization layer PL.

Figure 10B:
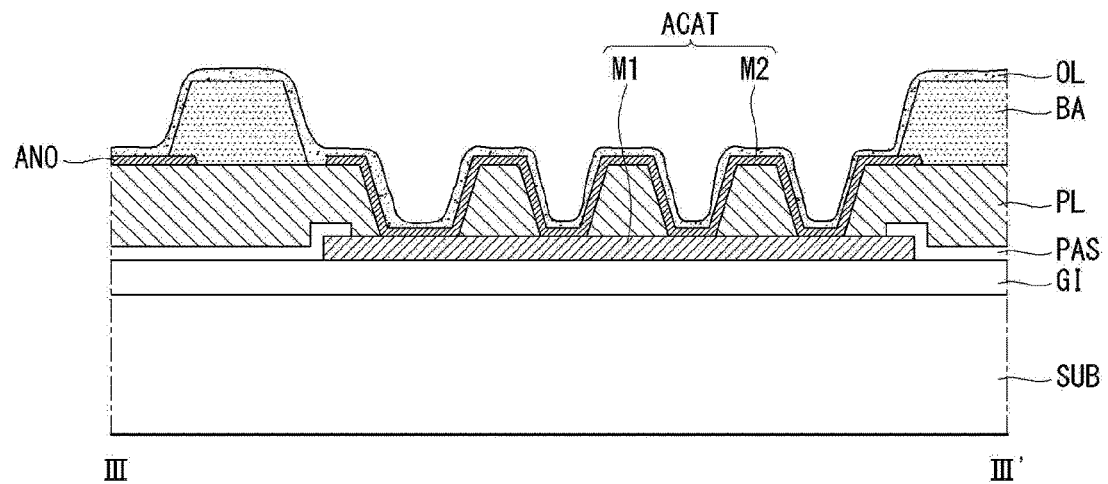

Referring to FIG. 10B, the organic emission layer OL made of an organic light-emitting material is deposited by a CVD (Chemical Vapor Deposition) method so that the bank pattern BA, the anode electrode ANO exposed through the opening portion of the bank pattern BA, and the second metal layer M2 of the auxiliary cathode electrode ACAT are covered.

Figure 10C:
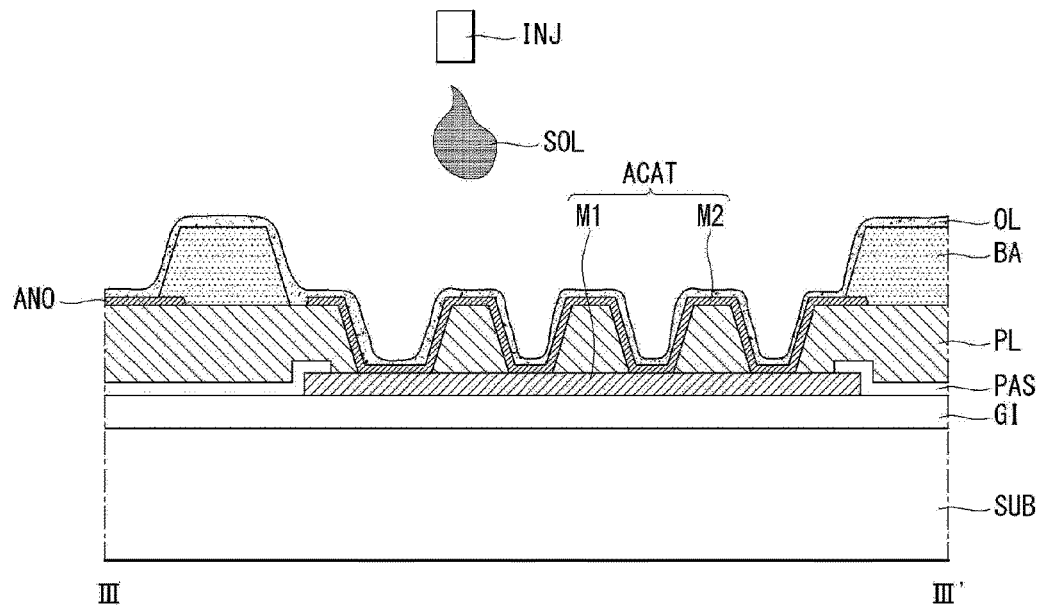
Figure 10D:
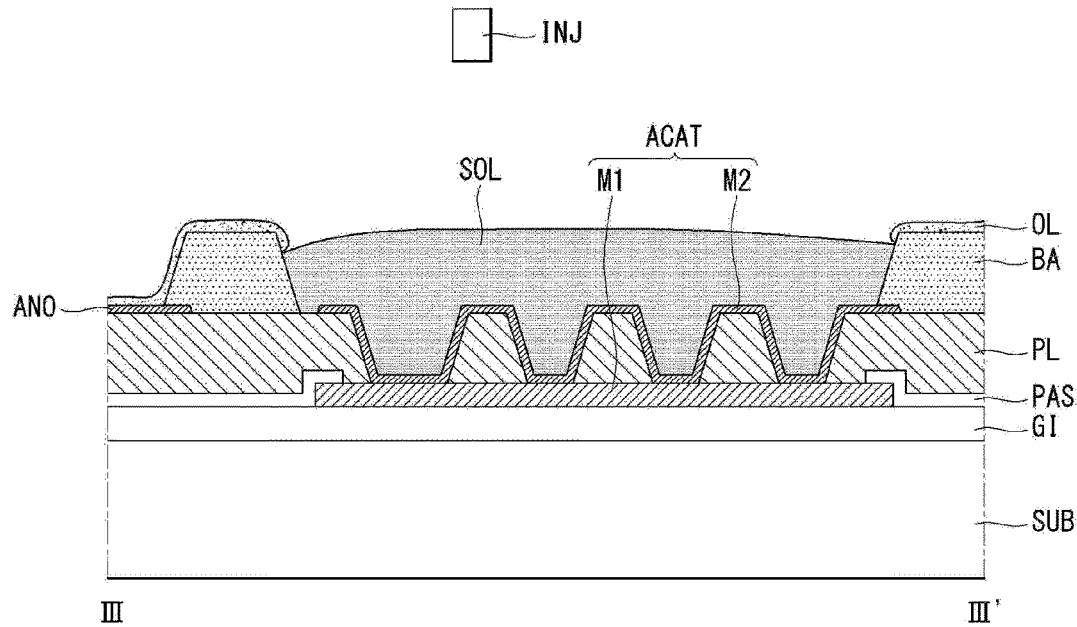
Figure 10E:
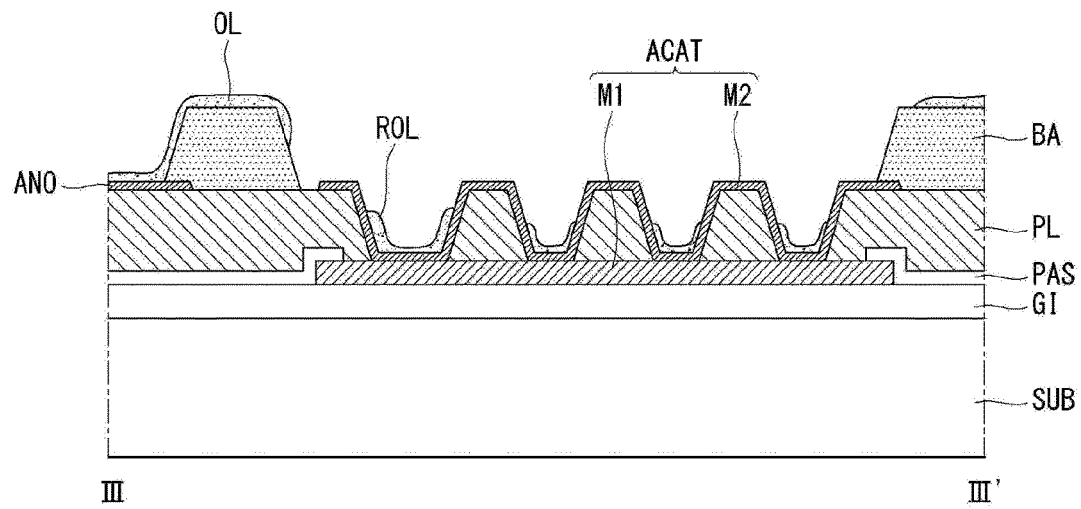

Referring to FIGS. 10C to 10E, a solvent is sprayed into the opening portion of the bank pattern BA on which the organic emission layer OL has been deposited using an inkjet device INJ. The organic emission layer OL on the second metal layer M2 is melted by the solvent. The organic light-emitting material that remains intact by drying gathers on the second metal layer M2 corresponding to the concave portion of the planarization film PL due to the concavo-convex structure of the planarization film PL having an island shape, thus forming the residual organic emission layer ROL. The second metal layer M2 is exposed at a plurality of second positions corresponding to the convex portions of the planarization film PL. That is, the second metal layer M2 formed on the planarization film PL is externally exposed as shown in FIG. 10e.

Figure 10F:
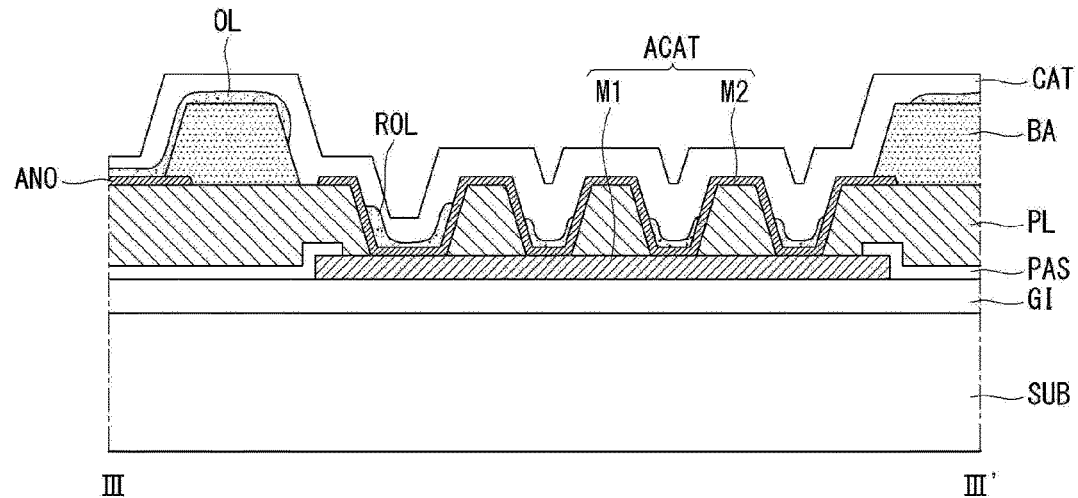

Referring to FIG. 10F, the cathode electrode CAT is formed by depositing a transparent conductive material on the substrate SUB in which the organic emission layer OL and the residual organic emission layers ROL have been formed.

The cathode electrode CAT is connected to portions of the second metal layer M2 of the auxiliary cathode electrode ACAT in which the residual organic emission layer has not been formed and which is externally exposed, the second metal layer M2 of the auxiliary cathode electrode ACAT is connected to the first metal layer M1, and the first metal layer M1 is connected to the first link pattern LP1 as shown in FIG. 8. The first link pattern LP1 is connected to the low potential source line VSL. Accordingly, the low potential source voltage is supplied to the cathode electrode CAT through the low potential source line VSL.

In accordance with the OLED device according to an embodiment of the present invention, there is an advantage in that a failure attributable to luminance irregularity due to a resistance deviation depending on a position of the display panel can be prevented because a deviation in the low potential source voltage of the cathode electrode depending on a position of the display panel can be minimized.

Furthermore, there is an advantage in that a contact between the auxiliary cathode electrode and the cathode electrode can be efficiently achieved by effectively removing a connection obstruction structure for the cathode electrode and the auxiliary cathode electrode according to an OLED device.

In forming an organic light-emitting diode of the related art OLED device, some layers (for example, a hole injection layer, a hole transport layer and an emission layer) of the organic light-emitting diode may be formed by a soluble method, and other layers (for example, an electron transport layer and an electron injection layer may be formed by an evaporation method. This is the reason why solvent material contained in the electron transport layer brings a serious adverse affect on quality of the emission layer if the electron transport layer is formed by the soluble method.

The OLED device according to the embodiment of the present invention is particularly useful when the emission layer of the organic light-emitting diode is formed by a chemical vapor deposition method in order to solve the mentioned above problems.

Those skilled in the art may change and modify the present invention in various ways without departing from the technical spirit of the present invention through the aforementioned contents.

For example, in the OLED device according to an embodiment of the present invention, the low potential source voltage has been illustrated as being supplied to the cathode electrode through the low potential source line, the first link pattern, and the auxiliary cathode electrode, but the first link pattern may be omitted and the low potential source line may be directly connected to the auxiliary cathode electrode.

It will be apparent to those skilled in the art that various modifications and variations can be made in the present invention without departing from the spirit or scope of the invention. Thus, it is intended that the present invention cover the modifications and variations of this invention provided they come within the scope of the appended claims and their equivalents.

What is claimed is:

1. An organic light-emitting diode display device comprising an organic light-emitting diode having an anode electrode, an organic emission layer, and a cathode electrode, the organic light-emitting diode display device comprising:
   a low potential source line configured to supply a low potential source voltage;
   at least one auxiliary cathode electrode configured to connect the low potential source line to the cathode electrode; and
   a first link pattern configured to be connected to the low potential source line,
   wherein the at least one auxiliary cathode electrode includes a first electrode layer connected to the first link pattern, and a second electrode layer connected to the first electrode layer at a plurality of first positions and connected to the cathode electrode at a plurality of second positions different from the plurality of first positions.

2. The organic light-emitting diode display device of claim 1, further comprising a second link pattern connected to another end of the at least one auxiliary cathode electrode and disposed in parallel to the first link pattern disposed to intersect the at least one auxiliary cathode electrode.

3. The organic light-emitting diode display device of claim 2, further comprising at least one third link pattern configured to connect the first link pattern to the second link pattern.

4. The organic light-emitting diode display device of claim 1, further comprising pixel regions partitioned by gate lines and data lines crossing each other,
   wherein, in a region in which the cathode electrode and the auxiliary cathode electrode are connected,
   the first metal layer of the auxiliary cathode electrode is disposed on a gate insulating film covering the gate line,
   a planarization layer having an opening portion exposing the first metal layer at the plurality of first positions is disposed on the first metal layer,
   a second metal layer is disposed on the planarization layer and connected to the first metal layer at the plurality of first positions,
   a residual organic emission layer is disposed at positions of the second metal layer corresponding to the plurality of first positions, and
   the cathode electrode is disposed on the residual organic emission layer and the second metal layer, and connected to the second metal layer at the plurality of second positions.

5. The organic light-emitting diode display device of claim 4, wherein:
   the first link pattern is disposed on the same layer as the gate line and made of the same material as the gate line, and
   the low potential source line is disposed on the gate insulating layer and made of with the same material as the data line.

6. The organic light-emitting diode display device of claim 5, wherein the low potential source line is connected to the first link pattern exposed through a contract hole penetrating the gate insulating layer in a non-display region.

7. The organic light-emitting diode display device of claim 6, wherein the cathode electrode is connected to the low potential source line through a contract hole through which the low potential source line is exposed in the non-display region.

8. The organic light-emitting diode display device of claim 6, wherein:
   the anode electrode and the second metal layer are made of a transparent conductive material, and
   the first link pattern and the first metal layer are made of a low resistance metal material having a specific resistance lower than the transparent conductive material.

9. A method of manufacturing a connection structure for connecting a cathode electrode and an auxiliary cathode electrode in an organic light-emitting diode display device in which an organic light-emitting diode having an anode electrode, an organic emission layer, and a cathode electrode are disposed in pixel regions partitioned by gate lines and data lines crossing each other, the method comprising:
   forming a first metal layer on a gate insulating film covering the gate line, the first metal layer being in parallel with the data line;
   forming a planarization film on the first metal layer to expose some region of the first metal layer;
   depositing a transparent conductive material on the planarization film, and forming the anode electrode and a second metal layer separated from each other by patterning the transparent conductive material;

depositing an organic light-emitting material to cover the anode electrode and the second metal layer;

jetting a solvent onto a region in which the second metal layer is formed and exposing the second metal layer by drying the solvent; and forming the cathode electrode covering the exposed second metal layer by depositing a transparent conductive material.

10. The method of claim 9, wherein the planarization film including a concavo-convex shape having concave portions and convex portions so that the first metal layer is exposed at a plurality of first positions.

11. The method of claim 10, wherein the second metal layer is exposed at a plurality of second positions corresponding to the convex portions of the planarization film.

12. The organic light-emitting diode display device of claim 1, wherein the first link pattern is connected to the low potential source line at a non-display area.

13. The organic light-emitting diode display device of claim 12, wherein the at least one auxiliary cathode electrode is connected to the first link pattern at the non-display area and connected to the cathode electrode at a display area.

* * * * *